United States Patent [19]

Chang et al.

[11] Patent Number: 5,723,355

[45] Date of Patent: Mar. 3, 1998

[54] METHOD TO INCORPORATE NON-VOLATILE MEMORY AND LOGIC COMPONENTS INTO A SINGLE SUB-0.3 MICRON FABRICATION PROCESS FOR EMBEDDED NON-VOLATILE MEMORY

[75] Inventors: Shang-De Ted Chang, Fremont; Binh Ly, San Jose, both of Calif.

[73] Assignee: Programmable Microelectronics Corp.

[21] Appl. No.: 785,234

[22] Filed: Jan. 17, 1997

[51] Int. Cl.$^6$ .............................................. H01L 21/8247
[52] U.S. Cl. .................................. 437/56; 437/43; 437/47; 437/52
[58] Field of Search ................................... 437/56, 57, 58, 437/43, 52, 47, 979; 148/DIG. 109

[56] References Cited

U.S. PATENT DOCUMENTS

| | | | |
|---|---|---|---|
| 4,651,406 | 3/1987 | Shimizu et al. | 437/43 |
| 4,663,645 | 5/1987 | Komori et al. | 257/316 |
| 5,057,448 | 10/1991 | Kuroda | 437/52 |
| 5,061,654 | 10/1991 | Shimizu et al. | 437/47 |
| 5,156,991 | 10/1992 | Gill et al. | 437/43 |
| 5,252,505 | 10/1993 | Yatsuda et al. | 437/58 |
| 5,254,489 | 10/1993 | Nakata | 437/43 |
| 5,580,807 | 12/1996 | Sery et al. | 437/43 |

*Primary Examiner*—Michael Trinh
*Attorney, Agent, or Firm*—Flehr, Hohbach, Test, Albritton & Herbert; William L. Paradice, III

[57] ABSTRACT

A semiconductor fabrication process allows for the fabrication of high-voltage transistors, logic transistors, and memory cells where, as required for sub-0.3 micron device geometries, the gate oxide of the logic transistors is thinner than the tunnel oxide thickness of the non-volatile memory cells without the undesirable contamination of the gate oxide of the logic transistors or contamination of the tunnel oxide of the memory cells. In one embodiment, the tunnel oxide of the memory cells is grown to a desired thickness. In a next step, a layer of doped polysilicon which will serve as the floating gate of the memory cell(s) is immediately deposited over the tunnel oxide of the memory cells, thereby protecting the tunnel oxide from contamination in subsequent masking and etching steps. The gate oxide of the logic transistors and the gate oxide of the high-voltage transistors are then grown to a desired thickness.

5 Claims, 5 Drawing Sheets

METHOD TO INCORPORATE NON-VOLATILE MEMORY AND LOGIC COMPONENTS INTO A SINGLE SUB-0.3 MICRON FABRICATION PROCESS FOR EMBEDDED NON-VOLATILE MEMORY

BACKGROUND

1. Field of the Invention

The present invention relates to a method of incorporating the fabrication of logic components, high-voltage components, and memory cells of a non-volatile MOS memory structure into a single deep submicron process flow.

2. Description of Related Art

Non-volatile MOS memory structures typically include three distinct components: the storage region, which includes the floating gate memory cells that store binary information, the logic region, which among other functions controls access to the memory cells, and the high-voltage isolation region, which isolates the selected portions of the memory structure from high voltages employed during programming and erasing of the selected memory cells. The transistors employed in each of the above-mentioned regions of a memory structure typically require different gate oxide thicknesses.

The gate oxide of the floating gate memory cells, i.e., the tunnel oxide, is normally of a thickness between approximately 80 and 100 Å to facilitate electron tunnelling, while the gate oxide of the high-voltage transistors which provide electrical isolation must normally be approximately 150 Å or more in order to sustain high voltages employed during programming and erasing of the floating gate memory cells. The thickness of the gate oxide of the transistors employed in the logic region of the memory structure (hereinafter referred to as logic transistors) depends upon the device geometry of the memory structure. For instance, where a 0.6 micron process technology is used in the fabrication of the memory structure, the gate oxide of the logic transistors should be approximately 120 Å, while a 0.5 micron process technology requires the gate oxide of the logic transistors to be approximately 110 Å. The relationship between minimum device geometry and gate oxide thickness of logic transistors for various sub-0.6 micron technologies is summarized below in Table 1.

TABLE 1

| minimum transistor dimensions (μm) | oxide thickness normally required (Å) |
|---|---|
| 0.6 | 120 |
| 0.5 | 110 |
| 0.4 | 100 |
| 0.3 | 80 |
| 0.25 | 65 |
| 0.18 | 45 |

It is well known that gate oxide becomes increasingly sensitive to impurities and therefore requires increasingly clean fabrication techniques as the thickness of the gate oxide is reduced. For instance, exposure of gate oxides having a thickness less than approximately 100 Å to photo-resist may result in extensive damage to the gate oxide and, therefore, degradation in device performance and reliability. Thus, where it is desired to form a memory structure containing floating gate memory cell having a tunnel oxide of between approximately 80–100 Å thick, care must be taken to ensure that during fabrication of such memory structure photo-resist and other masking structures containing impurities do not come into contact with the tunnel oxide. Otherwise, the tunnel oxide may become contaminated and may degrade data retention of the memory cells.

Conventional process flows used in the simultaneous fabrication of high-voltage, logic, and memory regions of a MOS memory structure contemplate depositing a layer of polysilicon (i.e., the floating gates of the memory cells) immediately after growth of the tunnel oxide is complete to avoid forming photoresist over the tunnel oxide. A process flow which operates in this manner is described below in the context of fabricating a memory structure 1 using 0.6 micron process technology with reference to FIGS. 1A–1E.

Referring to FIG. 1A, regions A, B, and C of memory structure 1 correspond to the high-voltage, logic, and memory regions, respectively, of memory structure 1. Thus, substrate 10 is shown divided into three regions: a region 10A on which high-voltage transistor will be formed, a region 10B on which logic transistors will be formed, and a region 10C on which memory cells will be formed. A uniform layer of oxide 20 is grown over substrate 10 to a thickness of approximately 125 Å in a suitable oxidation environment. A layer of suitable photo-resist is formed and patterned in a conventional manner, as shown in FIG. 1A, to cover only those portions of oxide layer 20 that correspond to the high-voltage and memory regions of memory structure 1, i.e., regions 20A and 20C of oxide layer 20. Thus, region 20B of oxide layer 20, which corresponds to the logic region of memory structure 1, remains exposed. Referring now to FIG. 1B, memory structure 1 is subjected to a suitable wet dip using, for instance, a HF or BOE (Buffer Oxide Etch) solution, to remove portion 20B of oxide layer 20. Photo-resist layer 30 is then removed using any well known technique.

Memory structure 1 is returned to the oxidation environment for further oxide growth until oxide regions 20A and 20C reach a thickness of approximately 150 Å, as shown in FIG. 1C. At this point the thickness of the oxide in logic region B, i.e., oxide region 20B, will have grown to a thickness of approximately 90 Å. A layer of photo-resist 40 is then formed and patterned as shown in FIG. 1C so as to cover oxide portions 20A and 20B while leaving exposed oxide portion 20C. Oxide portion 20C is then removed, as shown in FIG. 1D, thereby leaving substantially exposed a top surface of substrate portion 10C.

Memory structure 1 is again returned to the oxidation environment for oxide growth until oxide portions 20A, 20B, and 20C have grown to thicknesses of approximately 180 Å, 120 Å, and 80 Å, respectively. Fabrication of memory structure 1 is then completed in a well known manner. When complete, memory structure contains high-voltage transistors, logic transistors, and memory cells in regions A, B, and C, respectively, of memory structure 1. In this manner, the high-voltage transistors, logic transistors, and memory cells of a memory structure may be simultaneously fabricated to have gate oxides approximately 180 Å, 120 Å, and 80 Å thick, respectively, without contamination of the gate oxides of the logic and high-voltage transistors or the tunnel oxide of the memory cell.

When the process technology employed to fabricate MOS memory structures is smaller than approximately 0.4 microns, the gate oxide of the logic transistors and the tunnel oxide of the memory cells are both less than 100 Å thick and therefore must not come into contact with impurities such as those typically present in photo-resist. Where the device geometry is between approximately 0.3 and 0.4 microns, the gate oxide of the logic transistors and the tunnel oxide of the memory cells are of approximately the same thickness. In such instances, the gate oxide of the logic transistors and the tunnel oxide of the memory cells may be grown together so as avoid forming photo-resist on either the logic gate oxide or the tunnel oxide.

For instance, a layer of oxide is first grown to a desired thickness. Portions of the oxide layer lying within the logic and memory regions of the memory structure are removed during masking and etching steps similar to those described above. Oxide is then allowed to grow on the memory structure until the entirety of the gate oxide of the high-voltage transistors is of a first thickness and the entirety of the gate oxide of the logic transistors and the tunnel oxide of the memory cells is of a second thickness, where the second thickness is less than the first thickness.

However, fabrication processes according to that described above are not suitable for process technologies smaller than approximately 0.3 microns. When realizing device geometries smaller than approximately 0.3 microns, the gate oxide of the logic transistors should be thinner than the tunnel oxide of memory transistors. For example, a 0.25 micron process technology requires that the gate oxide of the logic transistors be approximately 65 Å thick. The thickness of the tunnel oxide of the memory cells, however, remains approximately 80 Å. Conventional fabrication processes such as that described above would suggest forming in a first step photo-resist over the tunnel oxide of the memory cells so that the gate oxide of the logic transistor may be removed in a suitable dipping solution, and then facilitating further oxide growth in a second step. Such a process, however, requires forming a layer of photo-resist over the tunnel oxide which, as discussed above, would undesirably contaminate the tunnel oxide of the memory cells.

SUMMARY

In accordance with the present invention, a process is disclosed which allows for the fabrication of high-voltage transistors, logic transistors, and memory cells where, as required for sub-0.3 micron device geometries, the gate oxide of the logic transistors is thinner than the gate oxide thickness of the non-volatile memory cells without the undesirable contamination of the gate oxide of the logic transistors or contamination of the gate oxide of the memory cells. In one embodiment, the tunnel oxide of the memory cells is grown to a desired thickness. In a next step, a layer of polysilicon which will serve as the floating gate of the memory cell(s) is immediately deposited over the tunnel oxide of the memory cells, thereby protecting the tunnel oxide from contamination in subsequent masking and etching steps. The gate oxide of the logic transistors and the gate oxide of the high-voltage transistors are then grown to a desired thickness in a manner similar to that described above with respect to FIGS. 1A–1E.

DETAILED DESCRIPTION

Embodiments in accordance with the present invention are discussed below in the context of forming a non-volatile MOS memory structure 2 using a 0.25 micron process technology with reference being made to FIGS. 2A–2F, where components common to memory structures 1 and 2 are similarly labelled. It is to be understood, however, that the discussion that follows is merely illustrative of the present invention and is not to be construed as limited to particular examples provided herein. For instance, those skilled in the art will, after reading this disclosure, be able to apply the teachings herein to the fabrication of semiconductor structures other than non-volatile memory structures.

Figure 1A:
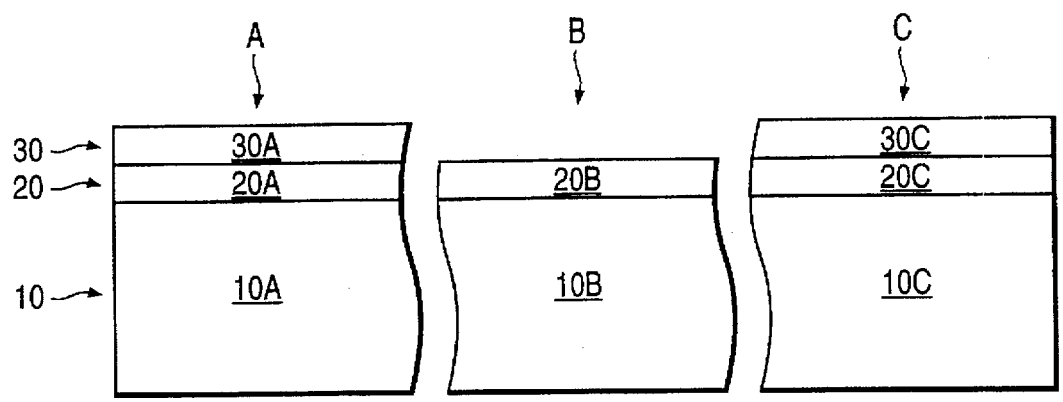
FIGS. 1A–1E illustrate a conventional process flow used in the simultaneous fabrication of high-voltage transistors, logic transistors, and memory cells of a memory structure.
Figure 1B:
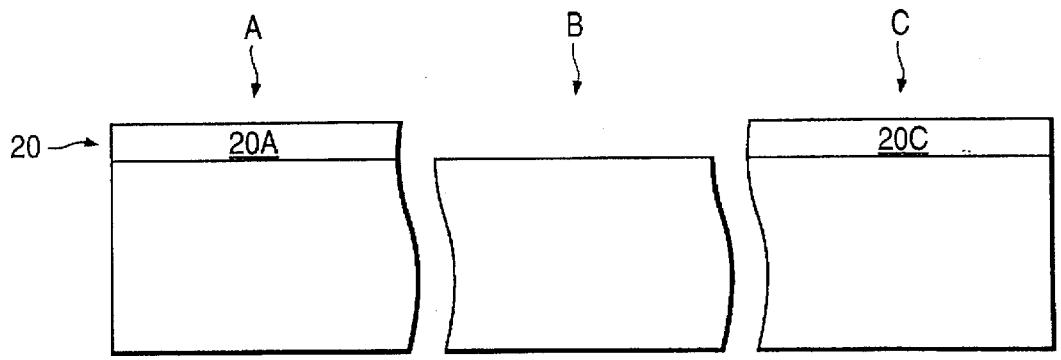
Figure 1C:
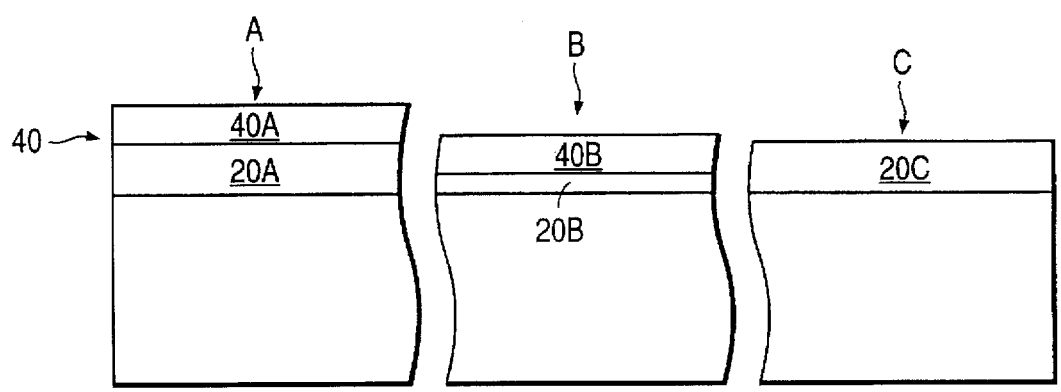
Figure 1D:
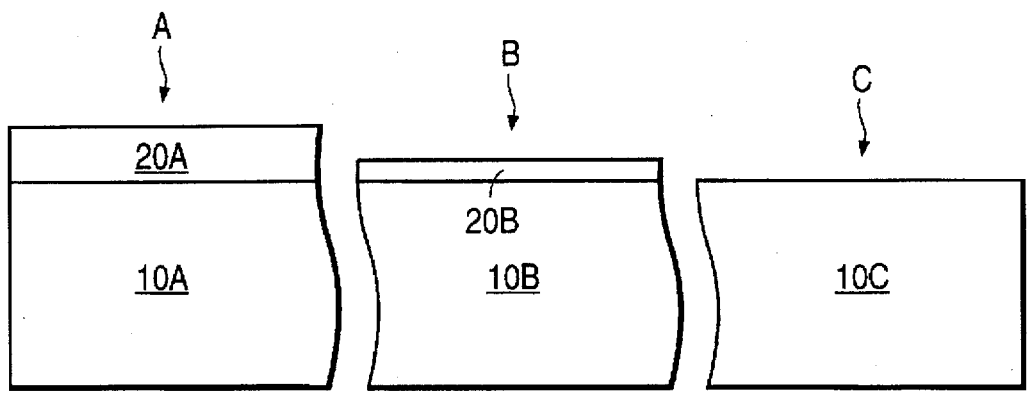
Figure 1E:
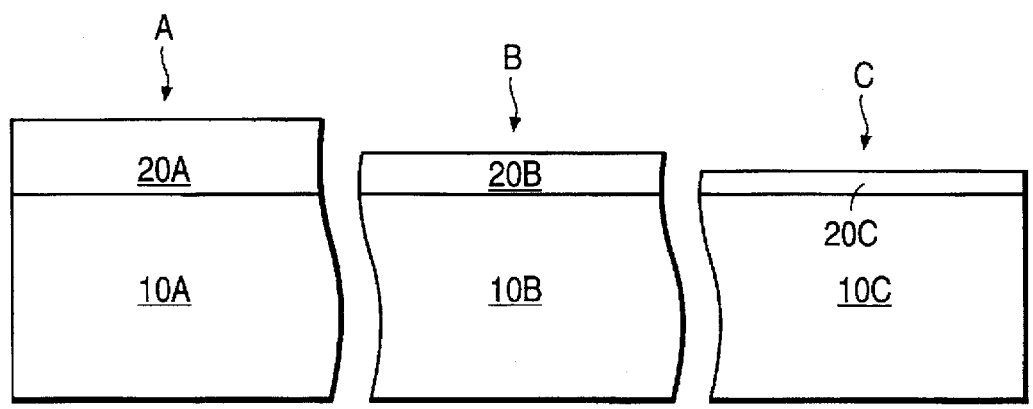
Figure 2A:
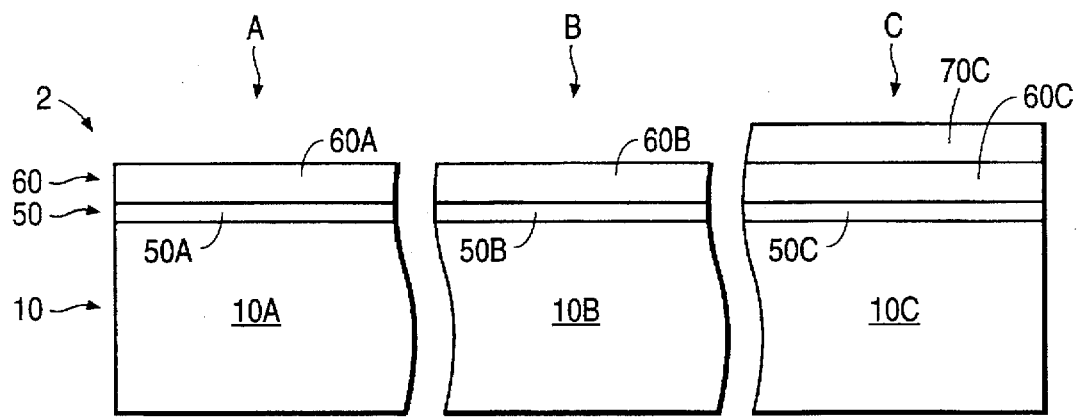
FIGS. 2A–2F illustrate a process flow in accordance with the present invention suitable for the simultaneous fabrication of high-voltage transistors, logic transistors, and memory cells of a memory structure.

Referring to FIG. 2A, regions A, B, and C of memory structure 2 correspond to the high-voltage, logic, and memory regions, respectively, of memory structure 2. Thus, as explained above, substrate 10 of memory structure 2 is illustrated in FIGS. 2A–2F as divided into portion 10A, on which high-voltage transistors will be formed, portion 10B, on which logic transistors will be formed, and portion 10C, on which memory cells will be formed. Note that substrate 10 may be either N or P type and may be either a substrate or a well region of a substrate.

Referring to FIG. 2A, a uniform layer of oxide 50 approximately 80 Å thick is grown on substrate 10 in a suitable oxidation environment. A layer of polysilicon 60 is deposited in a well known manner over all portions of oxide layer 50. Polysilicon layer 60 should be doped to a level consistent with that required for floating gates of non-volatile MOS memory cells. A layer photo-resist 70 is formed and patterned as shown in FIG. 2A to cover only portion 60C of polysilicon layer 60 corresponding to memory region C. Note that oxide layer 50 may be grown to any thickness suitable for the facilitation of electron tunneling or other programming mechanism in subsequently formed memory cells in region C of memory structure 2.

Figure 2B:
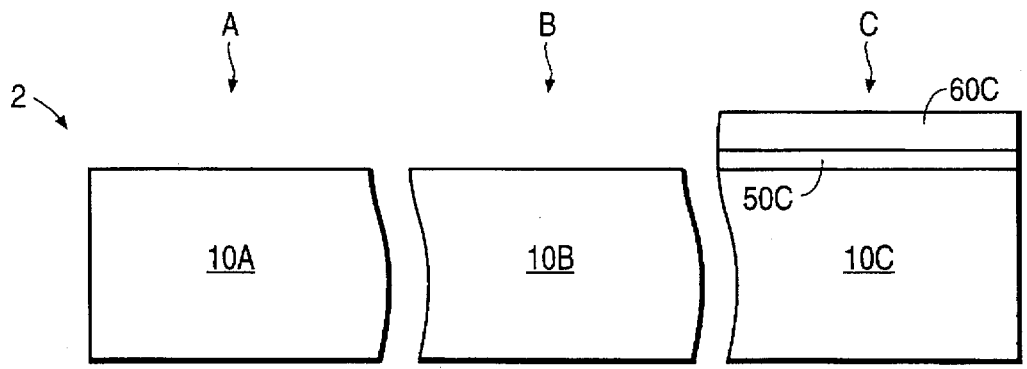

The exposed portions 60A and 60B of polysilicon layer 60 are then removed using a suitable dry etchant, as illustrated in FIG. 2B. Oxide portion 50C and polysilicon layer 60C serve as the tunnel oxide and floating gate, respectively, for memory cells formed in region C of memory structure 2.

Figure 2C:
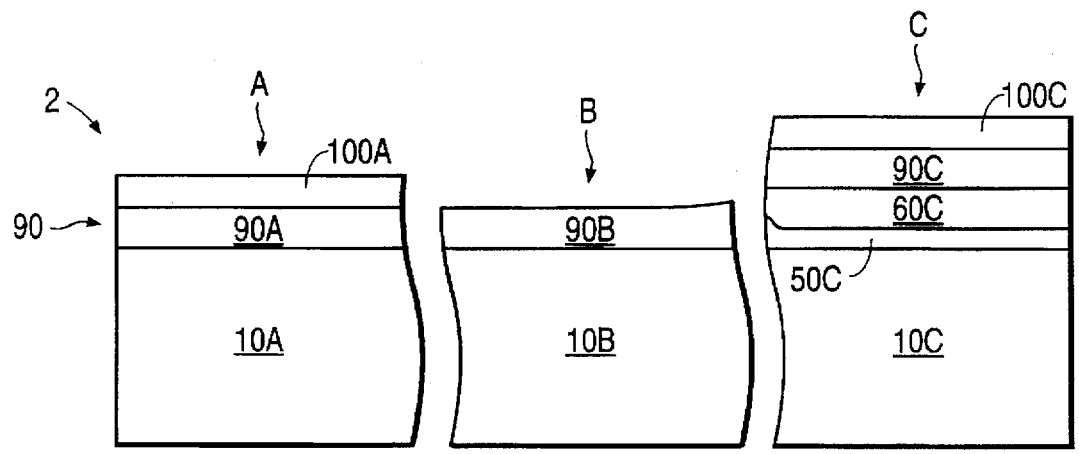

Referring to FIG. 2C, memory structure 2 is returned to the oxidation environment until a layer of oxide 90 is grown in high-voltage region A and logic region B of memory structure 2 to thickness of approximately 110 Å, where a device geometry of approximately 0.25 microns is desired. Note that during this oxidation step the thickness of portions 90C of oxide layer 90 will be approximately 170 Å. Portion 90C of oxide layer 90 is thicker than portions 90A and 90B of oxide layer 90 since oxide grows at a much faster rate over polysilicon than oxide grows over a silicon substrate. A layer of photo-resist 100 is formed and patterned as shown in FIG. 2C to cover portions 90A and 90C of oxide layer 90.

Figure 2D:
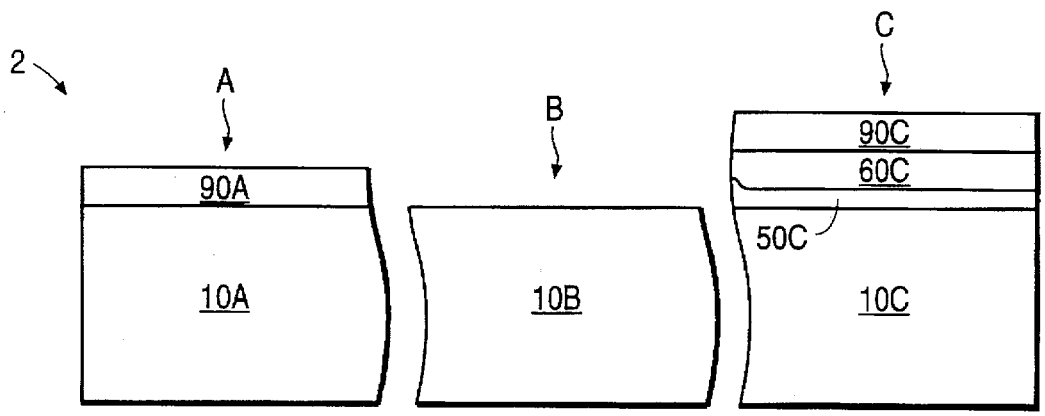

Memory structure 2 is wet dipped to remove exposed portion 90B of oxide layer 90, as shown in FIG. 2D. Photo-resist layer 100 is then removed using suitable techniques.

Figure 2E:
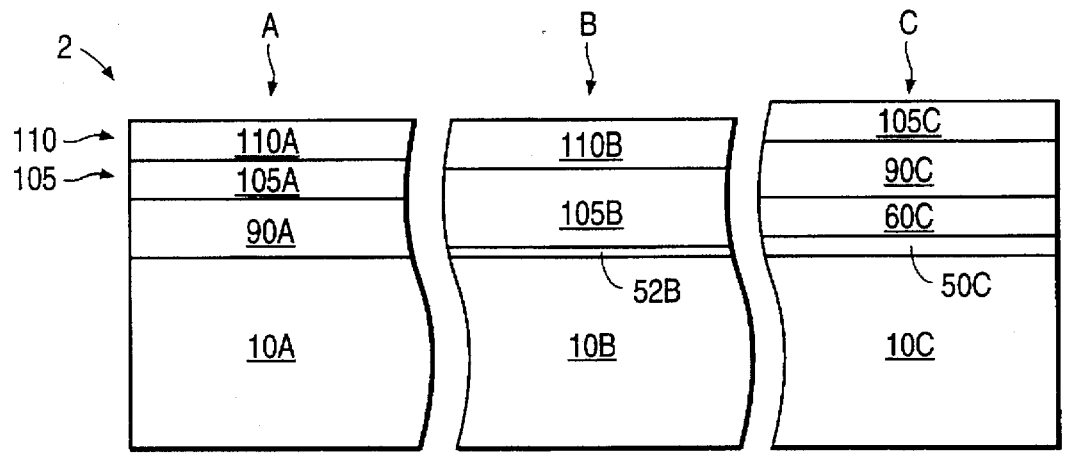

Memory structure 2 is returned to the oxidation environment until a layer of gate oxide 52B is grown to a thickness suitable for logic transistors, as shown in FIG. 2E. In this example, where a device geometry of approximately 0.25 microns is desired, gate oxide layer 52B should be approximately 65 Å thick. Note that during this oxidation step the thickness of oxide layer 90A will increase to approximately 130 Å and the thickness of portion 90C of oxide layer 90 increases to approximately 200 Å. A layer of doped polysilicon 105 is then deposited in a conventional manner over all of regions A, B, and C of memory structure 2. In some embodiments layer 105 may be a polycide material. A layer of photo-resist 110 is then formed and patterned as shown in FIG. 2E to expose only portion 105C of polysilicon layer 105. Note that photo-resist layer 110 defines the gates of the high-voltage transistors (region A) and the gates of the logic transistors (region B).

Figure 2F:
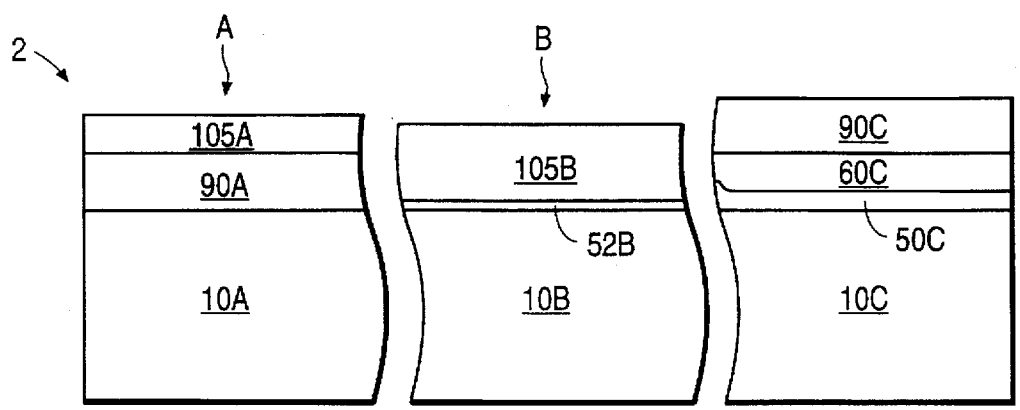

A dry etchant is employed to remove portion 105C of layer 105, as shown in FIG. 2F. Photo-resist layer 110 is then removed in a suitable manner. During the etching of portion 105C of layer 105, approximately 20 Å of oxide layer 90C is removed. Thus, referring to FIG. 2F, high-voltage region A of memory structure 2 includes a gate 105A insulated from substrate 10 by gate oxide layer 90A which, in the particular embodiment described herein, is approximately 130 Å thick. Logic region B of memory structure 2 includes a gate 105B insulated from substrate 10 by gate oxide layer 52B which, in the particular embodiment described herein, is approximately 65 Å thick. Memory region C of memory structure 2 includes a polysilicon floating gate 60C insulated from substrate 10 by tunnel oxide layer 50C which, in the particular embodiment described herein, is approximately 80 Å thick. Accordingly, embodiments of the present invention allow for the fabrication of memory structures having device geometries of less than approximately 0.3 microns, which as explained above requires that the gate oxide of the logic transistors be thinner than the tunnel oxide of the memory cells, without contamination of the gate oxide of the logic transistors and the tunnel oxide of the memory cells. The fabrication of such a memory structure in which the gate oxide thickness of the logic transistors is less than that of the memory cells was not feasible using conventional processes since the gate oxide of the memory cells must not come into contact with contaminants such as those typically found in photo-resist.

While particular embodiments of the present invention have been shown and described, it will be apparent to those skilled in the art that changes and modifications may be made without departing from this invention in its broader aspects and, therefore, the appended claims are to encompass within their scope all such changes and modifications as fall within the true spirit and scope of this invention. For instance, the layers of photo-resist mentioned above in accordance with the present invention may in other embodiments be replaced by any suitable masking layer.

We claim:

1. A method for fabricating a memory structure having a high-voltage region, a logic region, and a memory region, where said high-voltage region comprises isolation transistors, said logic region comprises logic transistors used to perform logic operations, and said memory region comprises memory cells, said method comprising the steps of:

growing a first layer of oxide on a major surface era semiconductor substrate to a thickness suitable for facilitating the tunneling of electrons therethrough;

depositing a first layer of polysilicon over said first layer of oxide;

removing portions of said first layer of polysilicon and said first layer of oxide which overlie said high-voltage and said logic regions, wherein the remaining portions of said first layer of polysilicon and said first layer of oxide which overlie said memory region serve as a floating gate and as a tunnel oxide, respectively, for said memory cells;

growing a second layer of oxide over said memory structure;

masking said second layer of oxide, using a layer of photo-resist, to expose only portions of said second layer of oxide which overlie said logic region, removing said portions of said second layer of oxide which overlie said logic region;

removing said layer of photo-resist;

growing a third layer of oxide over said memory structure, wherein portions of said third layer of oxide and said second layer of oxide which overlie said high-voltage region serve as gate oxides for said isolation transistors and wherein portions of said third layer of oxide and second layer of oxide which overlie said logic region serve as gate oxides for said logic transistors; and depositing and patterning a second layer of polysilicon over portions of said third layer of oxide which overlie said high-voltage region and said logic region.

2. The method of claim 1, wherein said thickness suitable for facilitating the tunneling of electrons is approximately 80 Angstroms.

3. The method of claim 1, wherein said second layer of oxide is approximately 110 Angstroms thick.

4. The method of claim 1, wherein said gate oxides for said isolation transistors are approximately 130 Angstroms thick.

5. The method of claim 1, wherein said gate oxides for said logic transistors are approximately 65 Angstroms thick.

* * * * *